(12) United States Patent
He et al.

(10) Patent No.: US 11,847,920 B2
(45) Date of Patent: Dec. 19, 2023

(54) METHOD FOR FEASIBILITY EVALUATION OF UAV DIGITAL TWIN BASED ON VICON MOTION CAPTURE SYSTEM

(71) Applicant: Tongji University, Shanghai (CN)

(72) Inventors: Bin He, Shanghai (CN); Gang Li, Shanghai (CN); Zhipeng Wang, Shanghai (CN); Yanmin Zhou, Shanghai (CN); Ping Lu, Shanghai (CN); Zhongpan Zhu, Shanghai (CN); Yang Shen, Shanghai (CN)

(73) Assignee: TONGJI UNIVERSITY

( * ) Notice: Subject to any disclaimer, the term of this patent is extended or adjusted under 35 U.S.C. 154(b) by 199 days.

(21) Appl. No.: 17/450,577

(22) Filed: Oct. 12, 2021

(65) Prior Publication Data

US 2022/0114897 A1 Apr. 14, 2022

(30) Foreign Application Priority Data

Oct. 12, 2020 (CN) .......................... 202011084633.7

(51) Int. Cl.
*G08G 5/00* (2006.01)
*B64C 39/02* (2023.01)
*B64U 101/00* (2023.01)

(52) U.S. Cl.
CPC ........... *G08G 5/003* (2013.01); *B64C 39/024* (2013.01); *G08G 5/0069* (2013.01); *B64U 2101/00* (2023.01)

(58) Field of Classification Search
CPC .... G08G 5/003; G08G 5/0069; G08G 5/0013; G08G 5/0026; G08G 5/0039; G08G 5/0052; G08G 5/0082; B64C 39/024; B64U 2101/00; B64U 2201/10; G06F 30/15; G06F 30/20; G05D 1/0808; G05D 1/101

See application file for complete search history.

(56) References Cited

U.S. PATENT DOCUMENTS

2018/0373247 A1\* 12/2018 Wang ................. G06N 5/022

FOREIGN PATENT DOCUMENTS

KR 101813698 B1 \* 1/2018

OTHER PUBLICATIONS

Machine Translation of KR-101813698-B1 (Year: 2018).\*

\* cited by examiner

*Primary Examiner* — Alan D Hutchinson
(74) *Attorney, Agent, or Firm* — Onello & Mello, LLP

(57) ABSTRACT

A system and a method are provided for feasibility evaluation of UAV Digital Twin based on Vicon motion capture system is disclosed, which establishes a mission feasibility evaluation model according to flight history data of a target UAV acquired by the UAV Digital Twin system. The mission feasibility evaluation model includes a UAV trajectory prediction module and a mission feasibility determination module. The UAV trajectory prediction module acquires real-time position and attitude information of the target UAV according to the Vicon motion capture system, and predicts target flight trajectory of the target UAV according to the real-time position and attitude information. The mission feasibility determination module compares the position difference between an end point of the target flight trajectory and preset designated mission point to evaluate feasibility of target mission of the target UAV.

20 Claims, 5 Drawing Sheets

METHOD FOR FEASIBILITY EVALUATION OF UAV DIGITAL TWIN BASED ON VICON MOTION CAPTURE SYSTEM

CROSS REFERENCE TO RELATED APPLICATIONS

The present application claims priority to Chinese Patent Application 202011084633.7, filed Oct. 12, 2020, entitled, METHOD FOR FEASIBILITY EVALUATION OF UAV DIGITAL TWIN BASED ON VICON MOTION CAPTURE SYSTEM, the entirety of which is incorporated herein by reference.

TECHNICAL FIELD

The present disclosure relates to the field of intelligent equipment technology and unmanned aerial vehicle (UAV) applications, and in particular to a method for mission feasibility evaluation of UAV Digital Twin driven by the Vicon motion capture system.

BACKGROUND

Generally, the unmanned aerial vehicle (UAV) kinematics and dynamics modeling greatly simplifies the UAV and its operating environment, but this simplification results in the UAV being unable to effectively achieve control accuracy when it comes to complex application scenarios. Thus this simplification greatly affects the implementation of UAV missions and can even result in damage to the equipment. "Digital Twin" modeling is the closest representation of an actual physical asset in operation, which reflects the current status of the real asset and includes the historical data related to the asset. Digital Twin can be used to evaluate the current status of the asset, and more importantly, it is also capable of future behavior forecasting, as well as fine control or operation optimization. The establishment of UAV Digital Twin to predict the future flight trajectory of the UAV will provide a basis for evaluating the feasibility of current mission of the UAV. The motion capture scheme of Vicon motion capture system can provide dynamic accuracy of up to 0.017 mm, which can provide the necessary UAV position and attitude information for the establishment of UAV Digital Twin and support the prediction of the future flight trajectory of the UAV. The establishment of the UAV Digital Twin driven by the Vicon motion capture system to evaluate the feasibility of the current mission of the UAV in advance will facilitate the termination of infeasible flight missions in advance and reduce the mission failure and property loss due to insufficient control accuracy of the UAV.

SUMMARY

An object of the present disclosure is to provide a method for feasibility evaluation of UAV Digital Twin based on Vicon motion capture system, in order to overcome the defects in the prior art, terminate infeasible flight missions in advance, and reduce the mission failure and property loss caused by insufficient control accuracy of the UAV.

The object of the present disclosure is achieved through the following technical schemes.

A method for feasibility evaluation of UAV Digital Twin based on Vicon motion capture system, where a mission feasibility evaluation model is established according to flight history data of a target UAV acquired by a UAV Digital Twin system. The mission feasibility evaluation model can include a UAV trajectory prediction module and a mission feasibility determination module, where the UAV trajectory prediction module acquires real-time position and attitude information of the target UAV according to the Vicon motion capture system, and predicts a target flight trajectory of the target UAV according to the real-time position and attitude information, and the mission feasibility determination module compares the position difference between an end point of the target flight trajectory and a preset mission designated point, so as to evaluate the feasibility of the target mission of the target UAV.

The UAV trajectory prediction module may predict the target flight trajectory of the target UAV in real time through a Temporal Sliding-Long Short-Term Memory (TS-LSTM) model.

The TS-LSTM model may take a translational rotation speed vector $\{V_t, \ldots, V_{t+n-1}\}$ and an acceleration vector $\{A_t, \ldots, A_{t+n-1}\}$ of the target UAV corresponding to n consecutive flight records $\{D_t, \ldots, D_{t+n-1}\}$ in the flight history data as inputs, where a flight record $D_t=(P_t,\theta_t,\Omega_t)^T=(x_t,y_t,z_t,\Phi_t,\theta_t,\Psi_t,\omega_{1t},\omega_{2t},\omega_{3t},\omega_{4t})^T$, thus forming a complete input at each time-step as $H_t=(D_t,V_t,A_t)^T$. Then, a spatial position of the target UAV after a preset time interval may be output as $P_{t+n+T-1}=(x_{t+n+T-1},y_{t+n+T-1},z_{t+n+T-1})^T$.

Further, the real-time position and attitude information may include the spatial position $P=(x,y,z)^T$ of the centroid of the target UAV and the Euler angle $\Theta=(\varphi,\theta,\psi)^T$ of the body coordinate system of the target UAV relative to a reference coordinate system, that is the attitude of the target UAV. Consecutive spatial positions of the target UAV may constitute the flight trajectory of the target UAV.

Further, calculation formulas of the translation rotation speed vector and the acceleration vector may be as follows:

$$V_t = (\dot{P}_t, \dot{\Theta}_t)^T = \left(\frac{P_t - P_{t-1}}{\Delta t}, \frac{\Theta_t - \Theta_{t-1}}{\Delta t}\right)^T$$

$$A_t = (\ddot{P}_t, \ddot{\Theta}_t)^T = \left(\frac{V_{t+1} - V_t}{\Delta t}\right)^T$$

In the formulas, $V_t$ is the translation rotation speed vector, $A_t$ is the acceleration vector, t is a time stamp, $P_t$ and $P_{t-1}$ are the spatial positions of the centroid of the target UAV at the times t and t−1 respectively, $\Theta_t$ and $\Theta_{t-1}$ are Euler angles of the body coordinate system of the target UAV relative to the reference coordinate system at the times t and t−1, respectively, and $\Delta t$ is a fixed time interval between two consecutive flight records.

Further, the fixed time interval between two consecutive flight records may be calculated according to a data sampling rate of the Vicon motion capture system, and the UAV Digital Twin system may set the data sampling rate of the Vicon motion capture system to a certain data sampling rate that does not exceed the rated sampling rate of its infrared camera.

Specifically, the position difference may refer to the real-time deviation between the end point of the target flight trajectory and the specified mission point that is preset.

Further, the maximum allowable deviation may be preset in the mission feasibility determination module, and when the real-time deviation is greater than the maximum allowable deviation, the mission feasibility determination module may determine that the target mission of the target UAV is infeasible, or vice versa.

The mission designated point may be a spatial reference position $P_r=(x_r,y_r,z_r)^T$ for determining whether the target mission of the target UAV is completed or not.

The flight history data may include the consecutive position and attitude information of the flight trajectory in a historical flight mission of the target UAV, and motor rotation speeds $\Omega=(\omega_1,\omega_2,\omega_3,\omega_4)^T$ and time stamps corresponding to the consecutive position and attitude information.

The UAV Digital Twin system may include a target UAV, a UAV ground control station, and a Vicon motion capture system. The UAV ground control station is provided with a wireless communication module through which the UAV ground control station may obtain the real-time position and attitude information of the target UAV in real-time, and receive motor rotation speed information of the target UAV. According to the flight data of the target UAV obtained by the UAV ground control station, and combined with the geometric structure and physical properties of the target UAV, the UAV Digital Twin system may establish a Digital Twin model of the target UAV based on the combination of data drive and physical modeling. The Digital Twin model of the target UAV may be updated regularly to reflect the real-time status of the target UAV, which may be recorded and saved as the flight history data of the target UAV.

Compared with the prior art, the present disclosure has obtained the following beneficial effects.

1. A UAV Digital Twin is established and driven by the Vicon motion capture system according to the present disclosure to realize the evaluation of the feasibility of the current mission of the UAV in advance, so as to facilitate the termination of infeasible flight mission in advance and reduce the mission failure and property loss caused by insufficient control accuracy of the UAV.

2. The extremely high dynamic precision of the Vicon motion capture system used in the present disclosure endows the UAV Digital Twin model with high reliability, and improves the ability of reflection of the UAV Digital Twin model for the current status of the UAV.

3. The present disclosure establishes a UAV trajectory prediction model based on the UAV historical data recorded by the UAV Digital Twin system, and combine the real-time UAV attitude information acquired by Vicon motion capture system to effectively predict the future flight trajectory of the UAV, and enhance the effectiveness of the feasibility assessment of the current flight mission of the UAV.

DETAILED DESCRIPTION OF THE EMBODIMENTS

Figure 1:
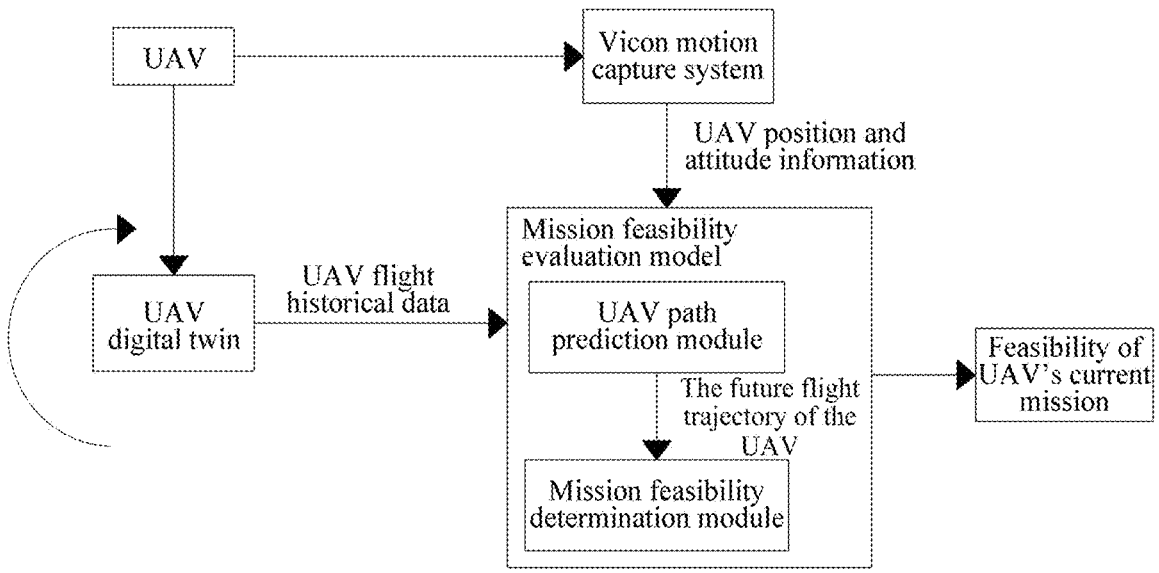
FIG. 1 is an embodiment of a structural schematic diagram of the present disclosure.

The present disclosure will be described in detail below with reference to drawings and specific embodiments. The embodiments shown and described are implemented on the premise of technical schemes in accordance with the present disclosure, and detailed implementations and specific operation process are given by way of example. However, the protection scope of the present disclosure is not limited to the following embodiments.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

To the extent that functional features, operations, and/or steps are described herein, or otherwise understood to be included within various embodiments of the present disclosure, such functional features, operations, and/or steps can be embodied in functional blocks, units, modules, operations and/or methods. And to the extent that such functional blocks, units, modules, operations and/or methods include computer program code, such computer program code can be stored in a computer readable medium, e.g., such as non-transitory memory and media, that is executable by at least one computer processor.

FIG. 1 is an embodiment of a structural schematic diagram, according to aspects of the present disclosure. As shown in FIG. 1, a system and method for feasibility evaluation of UAV Digital Twin based on Vicon motion capture system are provided, where a mission feasibility evaluation model 110 is established according to the flight history data of a target UAV 150 acquired by the UAV Digital Twin system 140. The mission feasibility evaluation model 110 includes a UAV trajectory prediction module 112 and a mission feasibility determination module 114. The UAV trajectory prediction module 112 acquires the real-time position and attitude information of the target UAV 150 according to the Vicon motion capture system 120, and predicts the target flight trajectory of the target UAV according to the real-time position and attitude information, and the mission feasibility determination module 114 compares the position difference between an end point of the target flight trajectory and a preset mission designated point, so as to evaluate, determine, and/or output a feasibility of the target mission of the target UAV 130.

Figure 2:
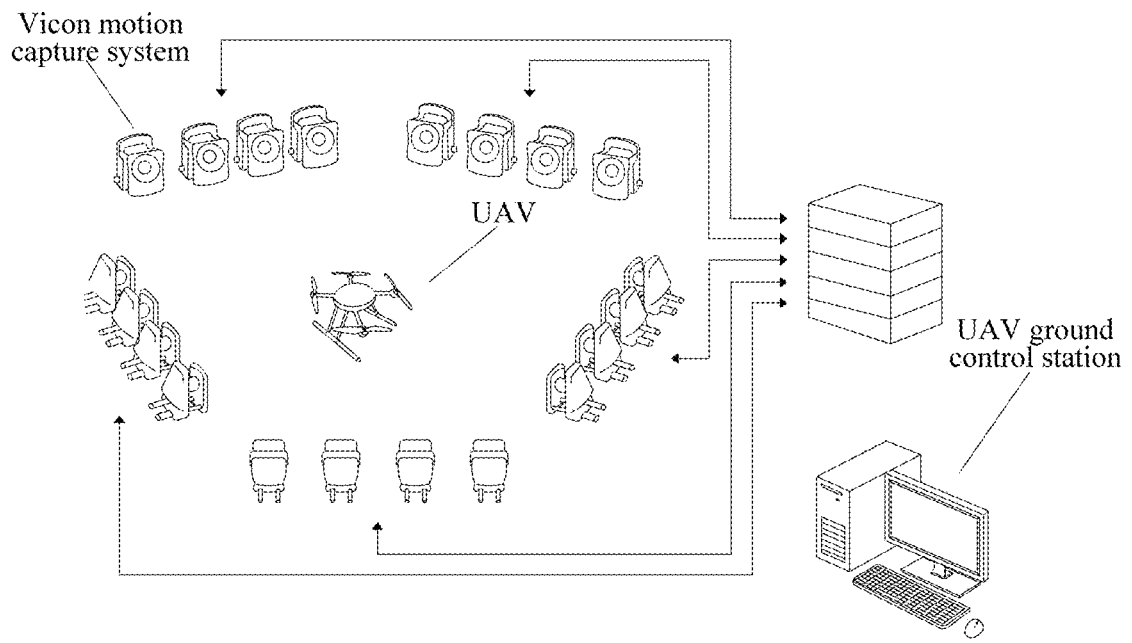
FIG. 2 is a diagram of an embodiment of actual physical effects of a UAV Digital Twin system, according to the present disclosure.

FIG. 2 is a diagram of an embodiment of actual physical effects of a UAV Digital Twin system, according to aspects of the present disclosure. As shown in FIG. 2, embodiments of the UAV Digital Twin system can include a target UAV 150, a UAV ground control station 210, and a Vicon motion capture system 120. The UAV ground control station 210 is provided with a wireless communication module through which the UAV ground control station obtains the real-time position and attitude information of the target UAV 150 in real-time, and receives motor rotation speed information of the target UAV. According to the flight data of the target UAV 150 obtained by the UAV ground control station 210, and combined with the geometric structure and physical properties of the target UAV, the UAV Digital Twin system 140 (see FIG. 1) establishes a Digital Twin model of the target UAV 150 based on the combination of data drive and physical modeling. The Digital Twin model of the target UAV 150 is updated regularly to reflect the real-time status of the target UAV, which is recorded and saved as the flight history data of the target UAV.

Figure 3:
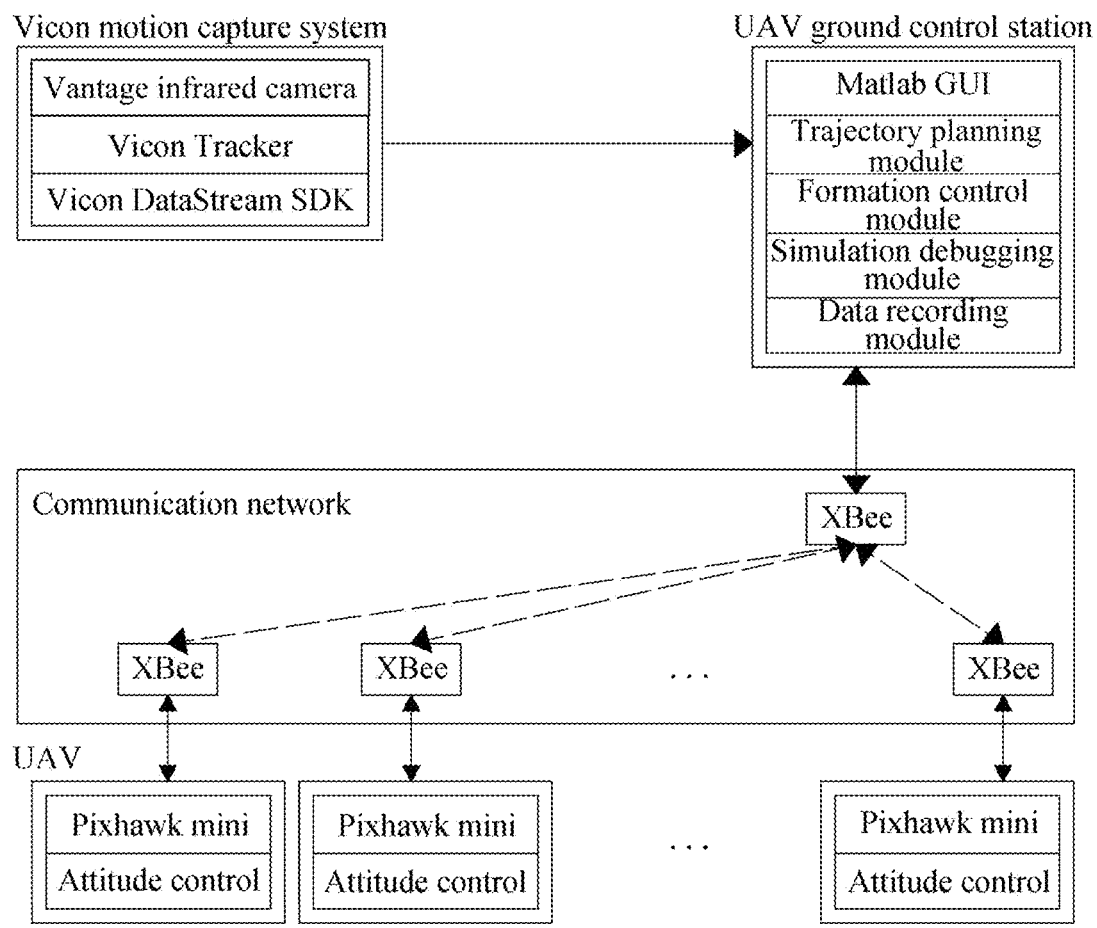
FIG. 3 is an architecture diagram of an embodiment of the UAV Digital Twin system, according to the present disclosure.

FIG. 3 is an architecture diagram of an embodiment of the UAV Digital Twin system, according to aspects of the present disclosure. As shown in FIG. 3, the UAV ground control station 210 receives the real-time UAV position and attitude information obtained from the Vicon motion capture system 120 and the UAV motor rotation speed information transmitted through an XBee wireless communication module 310, and transmits an attitude control instruction to the UAV 150.

The UAV ground control station 210 determines the position control of the UAV 150 by using a UAV position controller 152 and an attitude controller 154. In this embodiment, the target UAV 150 is a small quadrotor UAV, and Pixhawk mini 152 is used for the UAV flight control to realize the UAV attitude control. The Pixhawk mini flight control 152 uses a local NED coordinate system as the navigation coordinate system. The UAV position and attitude acquired by the Vicon motion capture system 120 is based on the Vicon coordinate system, and the acquired position and attitude information requires to be converted from the Vicon coordinate system to the local NED coordinate system.

Figure 4:
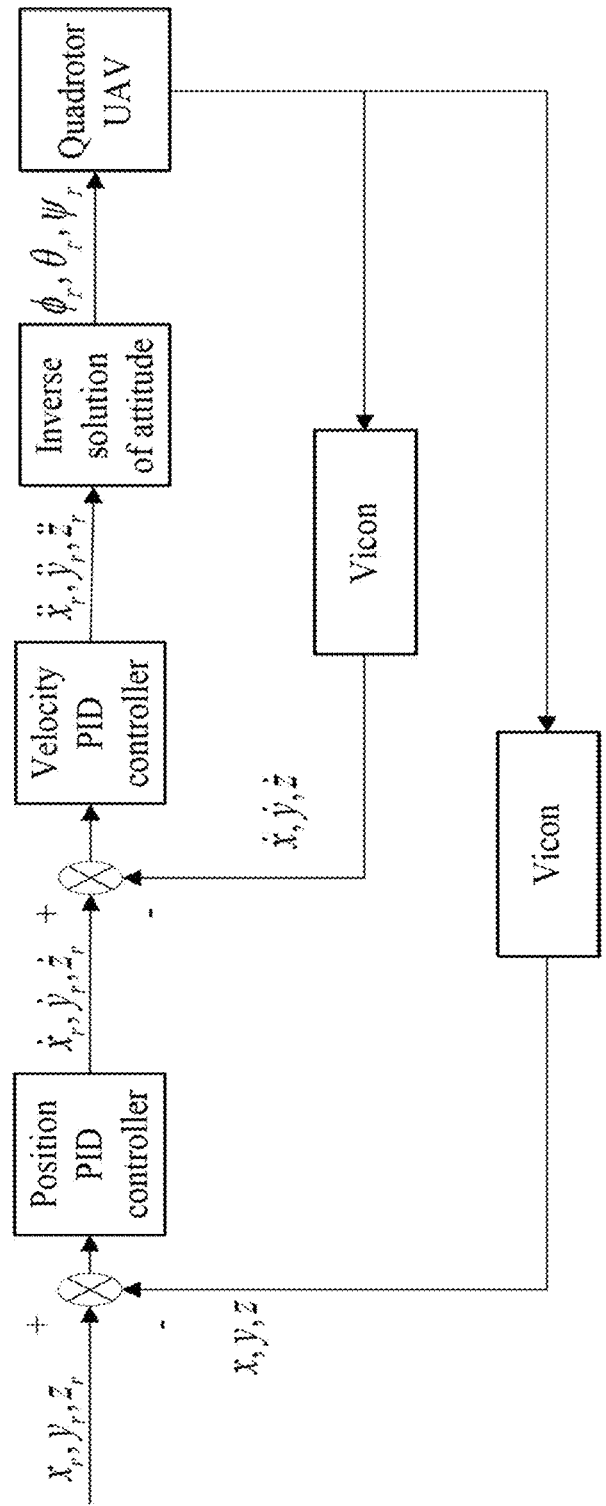
FIG. 4 is a block diagram of an embodiment of a UAV position controller, according to the present disclosure.
Figure 5:
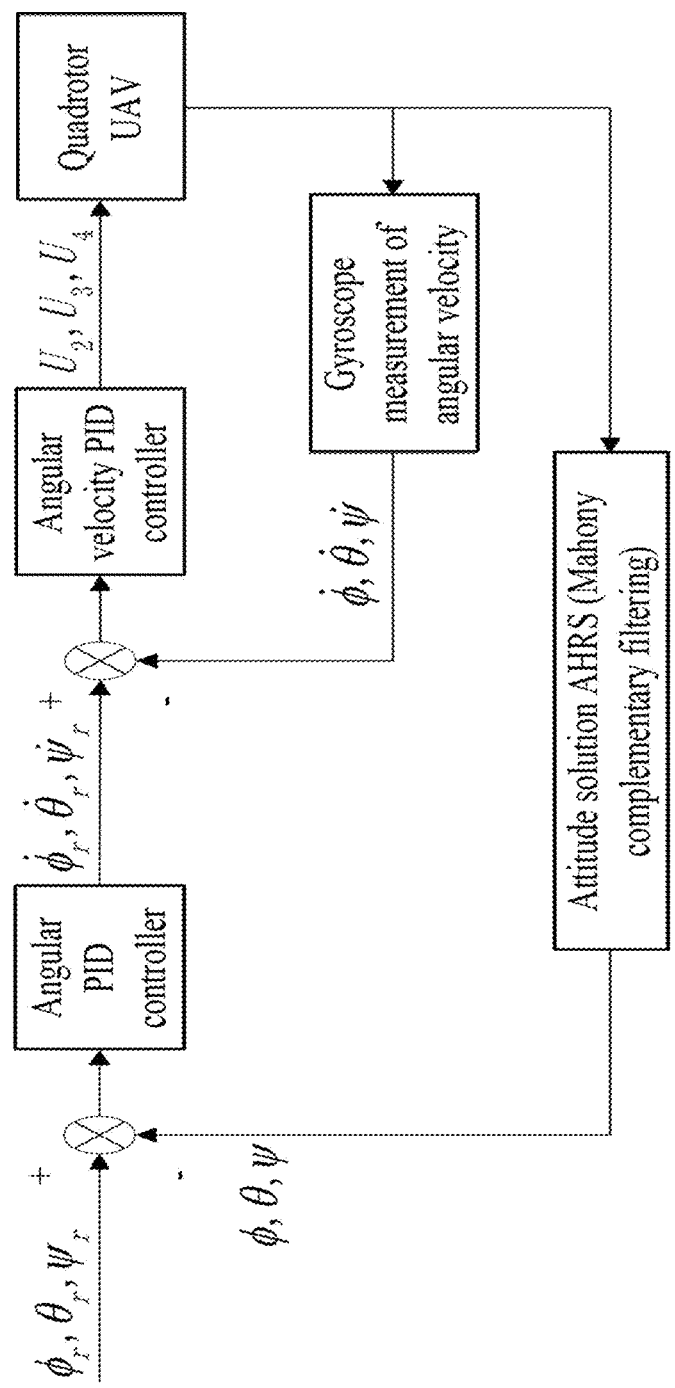
FIG. 5 is a block diagram of an embodiment of a UAV attitude controller, according to the present disclosure.

FIG. 4 is a block diagram of an embodiment of a UAV position controller and FIG. 5 is a block diagram of an embodiment of a UAV attitude controller, according to aspects of the present disclosure.

As shown in FIGS. 4 and 5, the UAV position controller 152 performs attitude inverse solution according to the acquired real-time position information of the target UAV 150 in combination with the preset flight trajectory points $(x_r, y_r, z_r)^T$ in the UAV flight mission, so as to obtain a desired UAV attitude $(\varphi_r, \theta_r, \psi_r)^T$, which is then processed by the UAV attitude controller 154, finally realizing the position control of the target UAV.

The UAV path prediction module 112 predicts the target flight trajectory of the target UAV in real-time through a TS-LSTM model.

Figure 6:
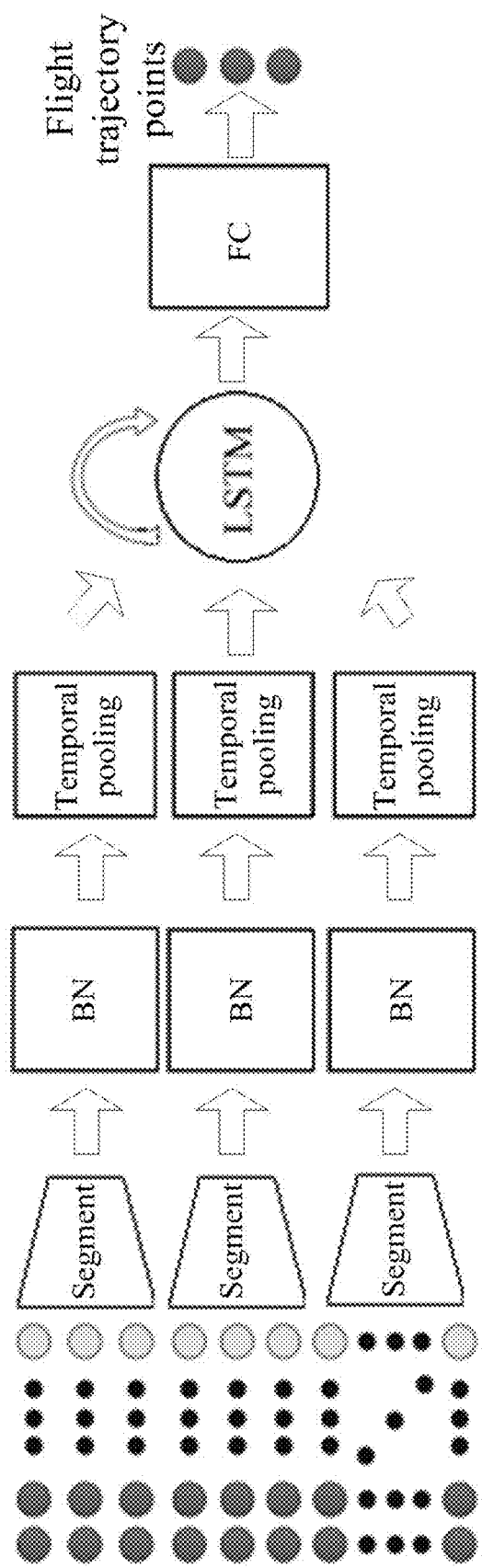
FIG. 6 is a structural schematic diagram of an embodiment of a TS-LSTM model according to the present disclosure.

The TS-LSTM model takes a translational rotation speed vector $\{V_t, \ldots, V_{t+n-1}\}$ and an acceleration vector $\{A_t, \ldots, A_{t+n-1}\}$ of the target UAV 150 corresponding to n consecutive flight records $\{D_t, \ldots, D_{t+n-1}\}$ in the flight history data as inputs, where a flight record $D_t=(P_t, \theta_t, \Omega_t)^T = (x_t, y_t, z_t, \Phi_t, \theta_t, \Psi_t, \omega_{1t}, \omega_{2t}, \omega_{3t}, \omega_{4t})^T$, thus forming a complete input at each time-step as $H_t=(D_t, V_t, A_t)^T$ to output the spatial position of the target UAV $P_{t+n+T-1}=(x_{t+n+T-1}, y_{t+n+T-1}, z_{t+n+T-1})^T$ after a preset time interval, which is the flight trajectory point $\hat{P}=(\hat{x}, \hat{y}, \hat{z})^T$ of the target UAV, as shown in FIG. 6.

FIG. 6 is a structural schematic diagram of an embodiment of a TS-LSTM model, according to aspects of the present disclosure.

The real-time position and attitude information may include the spatial position $P=(x,y,z)^T$ of the centroid of the target UAV and the Euler angle $\Theta=(\varphi,\theta,\psi)^T$ of the body coordinate system of the target UAV relative to the reference coordinate system, that is the attitude of the target UAV. Consecutive spatial positions of the target UAV 150 constitute the flight trajectory of the target UAV.

Calculation formulas of the translation rotation speed vector and the acceleration vector are as follows:

$$V_t = (\dot{P}_t, \dot{\Theta}_t)^T = \left(\frac{P_t - P_{t-1}}{\Delta t}, \frac{\Theta_t - \Theta_{t-1}}{\Delta t}\right)^T$$

$$A_t = (\ddot{P}_t, \ddot{\Theta}_t)^T = \left(\frac{V_{t+1} - V_t}{\Delta t}\right)^T$$

In the formulas, $V_t$ is the translation rotation speed vector, $A_t$ is the acceleration vector, t is a time stamp, $P_t$ and $P_{t-1}$ are the spatial positions of the centroid of the target UAV at the times t and t−1 respectively, $\Theta_t$ and $\Theta_{t-1}$ are Euler angles of the body coordinate system of the target UAV relative to the reference coordinate system at the times t and t−1, respectively, and $\Delta t$ is a fixed time interval between two consecutive flight records.

The fixed time interval between two consecutive flight records is calculated according to the data sampling rate of the Vicon motion capture system 120, and the UAV Digital Twin system 140 can set the data sampling rate of the Vicon motion capture system 120 to a certain data sampling rate not exceeding the rated sampling rate of its infrared camera.

In this embodiment, the Vicon motion capture system 120 adopts a Vantage V16 infrared camera as the camera component. The sampling frequency of the V16 camera is 120 Hz at a full resolution, and its sampling rate is set to 90 Hz according to use requirements. One hundred and eighty (180) flight records at consecutive moments are selected as the input to the TS-LSTM model and one flight record at an interval of 90 entries is taken as the output, so that $\Delta t$ is 1/90 second and T is 1 second. According to the input size, the Segment in the TS-LSTM model is set to 30.

Specifically, the position difference refers to the real-time deviation between the end point of the target flight trajectory and the specified mission point that is preset. The mission designated point is a spatial reference position $P_r=(x_r, y_r, z_r)^T$ for determining whether the target mission of the target UAV 150 is completed or not.

The maximum allowable deviation is preset in the mission feasibility determination module, and when the real-time deviation is greater than the maximum allowable deviation, the mission feasibility determination module determines that the target mission of the target UAV is infeasible. And when the real-time deviation is less (or equal to) than the maximum allowable deviation, the mission feasibility determination module determines that the target mission of the target UAV is feasible.

The flight history data includes the consecutive position and attitude information of the flight trajectory in the historical flight mission of the target UAV, and motor rotation speeds $\Omega=(\omega_1,\omega_2,\omega_3,\omega_4)^T$ and time stamps corresponding to the consecutive position and attitude information.

In addition, it should be noted that specific implementation examples described in the present disclosure can be named differently, and the contents described above in the present disclosure are only examples of the structure of the present disclosure. Equivalent or simple changes made according to the structure, features and principles of the present disclosure concepts all fall within the protection scope of the present disclosure. Those skilled in the technical field of the present disclosure can make various modifications or supplements to the specific examples described herein, or adopt similar methods, all of which fall within the protection scope of the present disclosure as long as they do not deviate from the structure of the present disclosure or exceed the scope defined by the claims.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

It is appreciated that certain features of the invention, which are, for clarity, described in the context of separate embodiments, may also be provide in combination in a single embodiment. Conversely, various features of the invention which are, for brevity, described in the context of a single embodiment may also be provided separately or in any suitable sub-combination.

What is claimed is:

1. A method for feasibility evaluation of unmanned aerial vehicle (UAV) Digital Twin based on a motion capture system with dynamic accuracy of up to 0.017 mm, comprising:

establishing a mission feasibility evaluation model based on flight history data of a target UAV acquired by a UAV Digital Twin system, wherein the mission feasibility evaluation model comprises a UAV trajectory prediction module and a mission feasibility determination module;

the UAV trajectory prediction module acquiring real-time position and attitude information of the target UAV according to the motion capture system, and predicting a target flight trajectory of the target UAV according to the real-time position and attitude information; and the mission feasibility determination module determining feasibility of a target mission of the target UAV by comparing a position difference between an end point of the target flight trajectory and a preset mission designated point.

2. The method according to claim 1, further comprising the UAV trajectory prediction module predicting the target flight trajectory of the target UAV in real-time using a TS-LSTM model.

3. The method according to claim 2, further comprising the TS-LSTM model receiving a translational rotation speed vector and an acceleration vector of the target UAV corresponding to the flight records as inputs according to a plurality of flight records at consecutive moments in the flight history data, and outputting a spatial position of the target UAV after a preset time interval.

4. The method according to claim 3, wherein the real-time position and attitude information comprises a spatial position of a centroid of the target UAV and a Euler angle of a body coordinate system of the target UAV relative to a reference coordinate system.

5. The method according to claim 4, wherein calculation formulas of the translation rotation speed vector and the acceleration vector are as follows:

$$V_t = (\dot{P}_t, \dot{\Theta}_t)^T = \left(\frac{P_t - P_{t-1}}{\Delta t}, \frac{\Theta_t - \Theta_{t-1}}{\Delta t}\right)^T$$

$$A_t = (\ddot{P}_t, \ddot{\Theta}_t)^T = \left(\frac{V_{t+1} - V_t}{\Delta t}\right)^T$$

wherein, $V_t$ is the translation rotation speed vector, $A_t$ is the acceleration vector, t is a time stamp, $P_t$ and $P_{t-1}$ are the spatial positions of the centroid of the target UAV at the times t and t−1, respectively, $\Theta_t$ and $\Theta_{t-1}$ are Euler angles of the body coordinate system of the target UAV relative to the reference coordinate system at the times t and t−1, respectively, and $\Delta t$ is a fixed time interval between two consecutive flight records.

6. The method according to claim 5, further comprising calculating the fixed time interval between two consecutive flight records according to a data sampling rate of the motion capture system.

7. The method according to claim 1, wherein the position difference comprises a real-time deviation between the end point of the target flight trajectory and the preset mission designated point.

8. The method according to claim 7, wherein the maximum allowable deviation is preset in the mission feasibility determination module, and if the real-time deviation is greater than the maximum allowable deviation, the mission feasibility determination module determines that the target mission of the target UAV is infeasible.

9. The method according to claim 7, wherein the maximum allowable deviation is preset in the mission feasibility determination module, and if the real-time deviation is less than the maximum allowable deviation, the mission feasibility determination module determines that the target mission of the target UAV is feasible.

10. The method according to claim 1, wherein the flight history data comprises the consecutive position and attitude information of the flight trajectory in a historical flight mission of the target UAV, and motor rotation speeds and time stamps corresponding to the consecutive position and attitude information.

11. The method according to claim 1, wherein:
    the UAV Digital Twin system comprises the target UAV, a UAV ground control station and the motion capture system; and
    the UAV ground control station comprises a wireless communication module through which the UAV ground control station obtains the real-time position and attitude information of the target UAV in real time, and receives motor rotation speed information of the target UAV.

12. A unmanned aerial vehicle (UAV) feasibility evaluation system, comprising:
a mission feasibility evaluation model based on flight history data of a target UAV acquired by a UAV Digital Twin system, wherein the mission feasibility evaluation model comprises a UAV trajectory prediction module and a mission feasibility determination module;
the UAV trajectory prediction module is configured to acquire real-time position and attitude information of the target UAV according to a motion capture system with dynamic accuracy of up to 0.017 mm, and to predict a target flight trajectory of the target UAV according to the real-time position and attitude information; and
the mission feasibility determination module is configured to determine a feasibility of a target mission of the target UAV by comparing a position difference between an end point of the target flight trajectory and a preset mission designated point.

13. The system according to claim 12, wherein the UAV trajectory prediction module is configured to predict the target flight trajectory of the target UAV in real-time using a TS-LSTM model,
wherein the TS-LSTM model is configured to receive a translational rotation speed vector and an acceleration vector of the target UAV corresponding to the flight records as inputs according to a plurality of flight records at consecutive moments in the flight history data, and output a spatial position of the target UAV after a preset time interval.

14. The system according to claim 13, wherein the real-time position and attitude information comprises a spatial position of a centroid of the target UAV and a Euler angle of a body coordinate system of the target UAV relative to a reference coordinate system.

15. The system according to claim 14, wherein calculation formulas of the translation rotation speed vector and the acceleration vector are as follows:

$$V_t = (\dot{P}_t, \dot{\Theta}_t)^T = \left(\frac{P_t - P_{t-1}}{\Delta t}, \frac{\Theta_t - \Theta_{t-1}}{\Delta t}\right)^T$$

-continued $$A_t = (\ddot{P}_t, \ddot{\Theta}_t)^T = \left(\frac{V_{t+1} - V_t}{\Delta t}\right)^T$$

wherein, $V_t$ is the translation rotation speed vector, $A_t$ is the acceleration vector, t is a time stamp, $P_t$ and $P_{t-1}$ are the spatial positions of the centroid of the target UAV at the times t and t−1, respectively, $\Theta_t$ and $\Theta_{t-1}$ are Euler angles of the body coordinate system of the target UAV relative to the reference coordinate system at the times t and t−1, respectively, and $\Delta t$ is a fixed time interval between two consecutive flight records.

16. The system according to claim 15, the UAV trajectory prediction module is configured to calculate the fixed time interval between two consecutive flight records according to a data sampling rate of the motion capture system.

17. The system according to claim 1, wherein the position difference comprises a real-time deviation between the end point of the target flight trajectory and the preset mission designated point.

18. The system according to claim 17, wherein the maximum allowable deviation is preset in the mission feasibility determination module, and mission feasibility determination module is configured to:
determine that the target mission of the target UAV is infeasible if the real-time deviation is greater than the maximum allowable deviation, and/or
determine that the target mission of the target UAV is feasible if the real-time deviation is less than the maximum allowable deviation.

19. The system according to claim 12, wherein the flight history data comprises the consecutive position and attitude information of the flight trajectory in a historical flight mission of the target UAV, and motor rotation speeds and time stamps corresponding to the consecutive position and attitude information.

20. The system according to claim 12, wherein:
the UAV Digital Twin system comprises the target UAV, a UAV ground control station, and the motion capture system; and
the UAV ground control station comprises a wireless communication module through which the UAV ground control station obtains the real-time position and attitude information of the target UAV in real time, and receives motor rotation speed information of the target UAV.

* * * * *